United States Patent [19]

Saito et al.

[11] Patent Number: 4,795,991

[45] Date of Patent: Jan. 3, 1989

[54] INLET TYPE NOISE FILTER DIRECTLY MOUNTED TO A PC BOARD

[75] Inventors: Yasuaki Saito; Tooru Harada, both of Nagaokakyo, Japan

[73] Assignee: Murata Manufacturing Co., Ltd., Kyoto, Japan

[21] Appl. No.: 2,483

[22] Filed: Jan. 12, 1987

[30] Foreign Application Priority Data

Jan. 13, 1986 [JP] Japan ................. 61-3692[U]

[51] Int. Cl.⁴ .................. H05K 7/10; H03H 7/00; H01R 4/54
[52] U.S. Cl. ........................... 333/181; 333/185; 361/400; 439/620
[58] Field of Search ............... 333/181, 185; 439/607, 439/620; 361/400

[56] References Cited

U.S. PATENT DOCUMENTS 2,961,631 11/1960 Smith ........................... 439/620 X
4,611,185 9/1986 Diomeyer et al. ............. 333/185 X
4,620,165 10/1986 Kinzler ......................... 333/185 X
4,695,115 9/1987 Talend .......................... 439/607 X

FOREIGN PATENT DOCUMENTS 2446714 4/1976 Fed. Rep. of Germany ...... 333/181
2759081 7/1979 Fed. Rep. of Germany ...... 333/181
3416786 11/1984 Fed. Rep. of Germany ...... 361/302

*Primary Examiner*—Eugene R. LaRoche
*Assistant Examiner*—Benny Lee
*Attorney, Agent, or Firm*—Wenderoth, Lind & Ponack

[57] ABSTRACT

An inlet type noise filter which can be directly mounted to a substrate or the like includes a casing, a pair of output terminals, a ground terminal projecting from a surface of the casing and a retaining portion projecting from the same surface of the casing that the terminals project from. The retaining portion extends through bores in the substrate and engage the substrate to secure the noise filter to the substrate. The terminals can then be operatively electrically connected by soldering or the like to conductive patterns on the substrate.

4 Claims, 3 Drawing Sheets

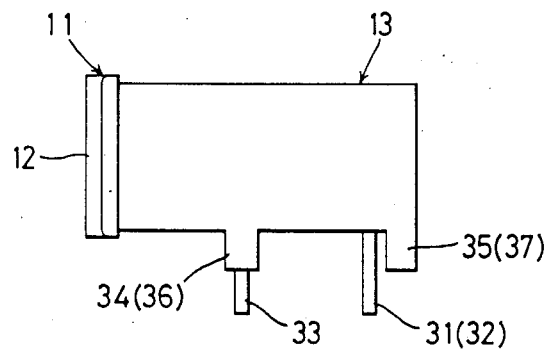
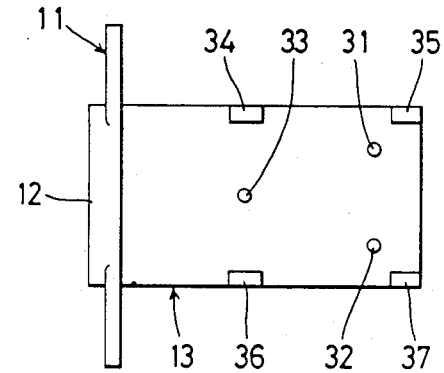
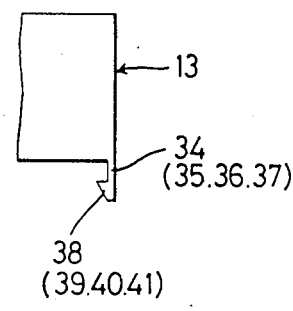
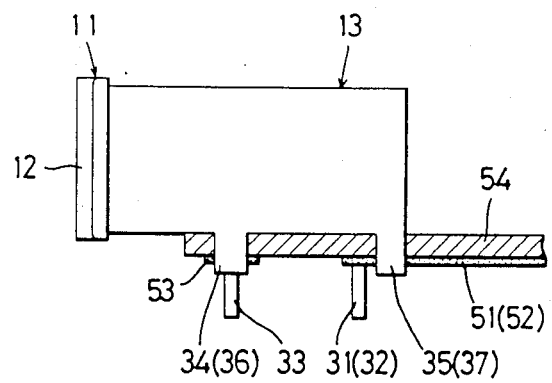
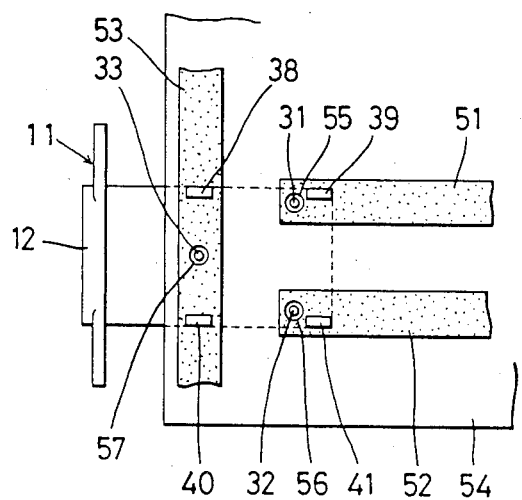

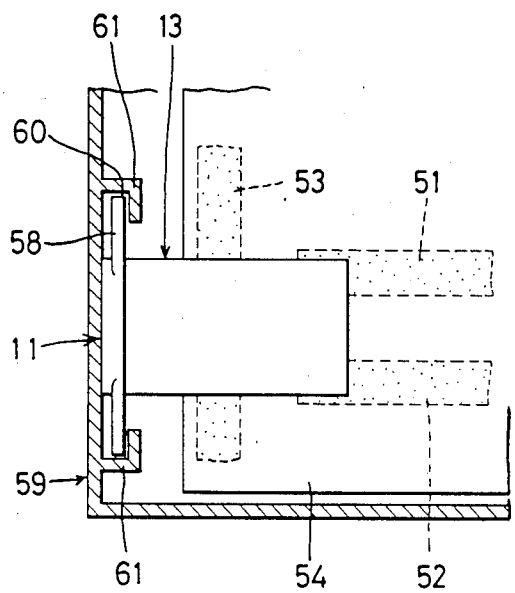
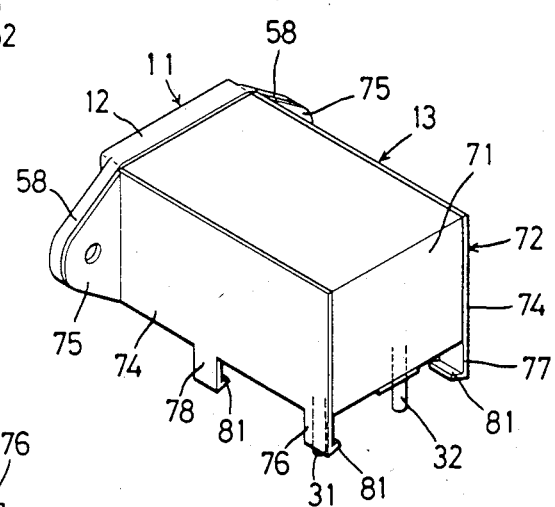
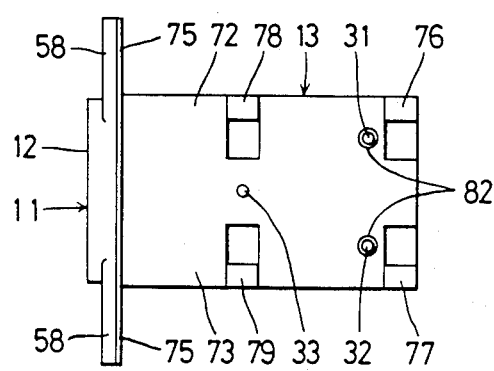
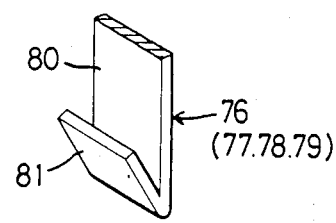

INLET TYPE NOISE FILTER DIRECTLY MOUNTED TO A PC BOARD

BACKGROUND OF THE INVENTION

The present invention relates to an inlet type noise filter and, more particularly, to an inlet type noise filter which can be mounted directly on a mounting substrate or the like.

The conventional inlet type noise filter, as shown in FIGS. 10 and 11, has an inlet socket 11 mounted on a rectangular casing 13. A bayonet portion 12 of the socket 11 is disposed over an open end of the casing 13 so as to be exposed at the exterior of the casing. A filter circuit (not shown) comprising inductors and capacitors forming an equivalent circuit as shown in FIG. 12 is provided at the rear side of the socket 11 and lug-shaped output terminals 14 and 15 and a ground terminal 16 are fixed on the surface of the casing 13 that extends perpendicular to the open end of the casing.

In addition, the output terminals 14 and 15 are fixed onto thick projections 17 and 18 formed on the surface extending perpendicular to the open end.

The conventional inlet type noise filter constructed as described above, as shown in, for example FIG. 13 is mounted on a box 21 of an electric instrument or the like with the bayonet portion 12 exposed and with the terminals 14, 15 and 16 electrically connected with a printed substrate 22 through lead wires 23, 24 and 25, respectively.

Such a conventional inlet type noise filter is mounted by performing complicated connection work, and is subject to a problem in that the noise produced within the box 21 is distributed to the lead wires 23, 24 and 25 thereby diminishing the filter function of the noise filter.

When the noise filter is intended to be mounted directly on the printed substrate in order to solve the above-mentioned problem, the casing 13 of the noise filter is not flat but is stepped at the surface on which the terminals are fixed and through which the casing 13 is attached to the box 21, thereby resulting in inconvenience in that the filter cannot stably be mounted on the box 21.

SUMMARY OF THE INVENTION

A first object of the invention is to provide an inlet type noise filter which can be mounted simply and reliably on a substrate or the like.

A second object of the invention is to provide an inlet type noise filter having superior filter characteristics.

BRIEF DESCRIPTION OF THE DRAWINGS

The above and other objects and features of the invention will appear more fully hereinafter from a consideration of the following description taken in connection with the accompanying drawings in which preferred embodiments of the present invention are illustrated by way of example.

FIG. 1 is a side view of a first embodiment of an inlet type noise filter of the invention, FIG. 2 is a bottom plan view of the embodiment of FIG. 1, FIG. 3 is an enlarged rear view of a retainer portion of the same, FIG. 4 is a side view of the noise filter of the first embodiment mounted on a substrate, FIG. 5 is a bottom view thereof, FIG. 6 is a cross-sectional view thereof, FIG. 7 is a perspective view of a second embodiment of the inlet type noise filter of the invention, FIG. 8 is a bottom view of the same, FIG. 9 is an enlarged perspective view of a retainer portion thereof.

DETAILED DESCRIPTION OF THE PREFERRED EMBODIMENTS

Figure 10:
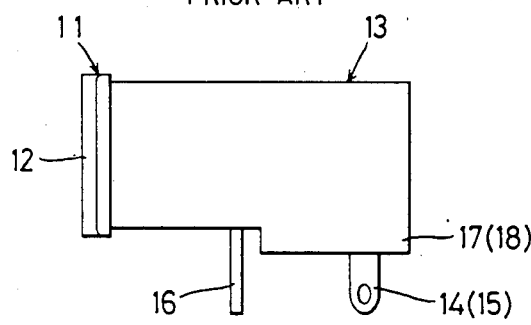
FIG. 10 is a side view of a conventional inlet type noise filter.
Figure 11:
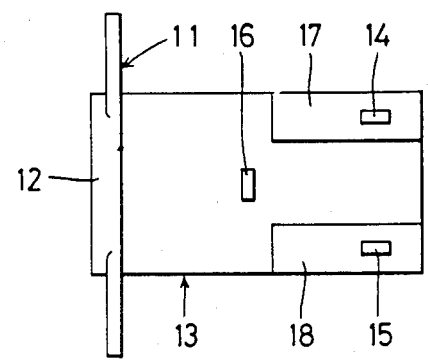
FIG. 11 is a bottom view thereof.
Figure 12:
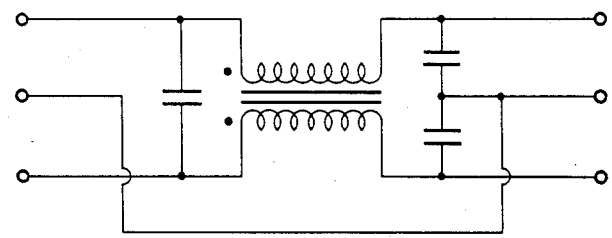
FIG. 12 is an equivalent circuit diagram of a filter circuit.
Figure 13:
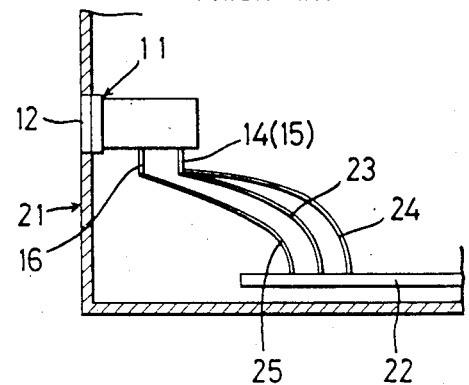
FIG. 13 is a longitudinal sectional view of the conventional noise filler mounted on a box.

In a first embodiment of the inlet type noise filter shown in FIGS. 1 through 6, casing 13 is formed from synthetic resin, which is basically the same as in the conventional device shown in FIGS. 10 and 11, i.e. the components in the first embodiment that are the same as those in the conventional device are designated by the same reference numerals, and the description thereof is omitted.

Referring to FIGS. 1 through 6, again, reference numeral 1 designates a casing formed from synthetic resin, reference numerals 31 and 32 designate pin-shaped output terminals, reference numeral 33 designates a pin-shaped earth terminal, the terminals being fixed to the surface of the casing 13 and extending perpendicular to the surface and through respective openings therein, and reference numerals 34, 35, 36 and 37 designate four retainer portions projecting downwardly from the bottom of the casing 13 in the same direction as the respective terminals 31, 32 and 33.

The retainer portions 34, 35, 36 and 37, as shown in FIG. 3, are provided at the outermost ends thereof with hooks 38, 39, 40 and 41, respectively.

The first embodiment of the inlet type noise filter of the invention as described above is used as shown in FIGS. 4 and 5.

More specifically, a mounting substrate 54, such as a printed substrate, is provided on one surface thereof with a pair of electrically conductive patterns 51 and 52 and a grounding pattern 53, and the terminals 31, 32 and 33 are inserted into the substrate 54 from the other surface thereof through bores 55, 56 and 57 extending through the substrate. The output terminals 31 and 32 are connected with the electrically conductive patterns 51 and 52, and the ground terminal 33 is connected with the ground pattern 53 by soldering or the like (not shown) respectively.

At this time, the retainer portions 34, 35, 36 and 37 are inserted into bores (not shown) extending through the substrate 54 and are locked to the substrate 54 by the hooks 38, 39, 40 and 41, respectively.

Also, at this time, an inlet socket 11, as shown in FIG. 6, has flange portion 58 which is inserted into slits 60 provided in a box 59 of an electronic instrument or the like to thereby fix the noise filter to the box 59.

The slits 60 are formed by a pair of positioning members 61 which are substantially L-shaped, are disposed along the inner surface of the box 59 and are integral therewith. The flange portion 58 is supported between the positioning members 61 to thereby fix the noise filter to the box 59.

The pair of positioning members 51 forming the slits 60 serve to position the noise filter and also to effectively absorb pressure applied to the inlet socket 11 when a plug is plugged into socket 11 or removed therefrom.

Next, referring to FIGS. 7 through 9, a second embodiment of an inlet type noise filter of the invention is shown, in which a casing 13 is made of metal and in which components that are the same as those of the first embodiment are designated by the same reference numerals with the description thereof being omitted.

The casing 13 in the second embodiment, as shown in FIGS. 7 and 8, consists of a synthetic resin casing 71 and a metal casing 72 fitted around the casing 71. The metal casing 72 has a substantially U-shaped cross section including side plates 74, at both widthwise sides of a bottom plate 73 and is adapted to be fitted onto both the side walls of the resin casing 71 from the bottom thereof.

The metal casing 72 is provided at respective ends of each of the side plates 74 with flanges 75 projecting outwardly therefrom respectively, so that the flanges 75 can abut against the flange portion 58 of the inlet socket 11. Also, at the lower edges of both the side plates 74 are two pairs of retainer portions 76, 77 and 78, 79 which are formed by cutting the bottom plate 73 and bending the cut portions downwardly.

The retainer portions 76, 77, 78 and 79, as shown in FIG. 9, each have a hook 81 formed by bending the end of an extension 80 of each side plate 74. The hook 81 engages the lower surface of the substrate 54 when the respective retainer portions 76, 77, 78 and 79 are inserted into bores (not shown) extending through the substrate 54 to mount the noise filter to the substrate 54.

Also, in the second embodiment using the metal casing 13, the input and output terminals 31 and 32, as shown in FIG. 8, are spaced a predetermined distance from the bottom plate 73 of metal casing 72 by insulators 82, such as insulating bushings, which insulators also guide the terminals 31, 32 to the exterior.

When using the metal casing, the noise filter can be mounted on the box 59 in a manner in which the flanges 75 at the metal casing 72 and the positioning members 61 of the box 59 can be electrically connected with each other, thereby ensuring grounding of the casing 72.

When the noise fitter is mounted on the printed substrate 54 or the like, the retainer portions 78 and 79 can be soldered to the grounding pattern 53 above the ground terminal 33, thereby further ensuring grounding.

Accordingly, the casing using the metal casing 72 is further superior with respect to reliability of grounding.

In addition, the fixing of the noise filter to the box 59 by the elements shown in the drawing, is not limitative of the present invention but bolts and nuts may, as is well-known, be used to fix the noise filter to the same.

The inlet type noise fIlter is also not limited to the specifics of the embodiments disclosed herein, but may of course be varied without departing from the true scope of the invention.

For example, the inlet socket 11 may alternatively be mounted on a surface extending along the length of the casing 13 or on a surface opposite to the surface to which terminals 31, 32 and 33 are fixed.

The filter circuit may be disposed at the lateral side of the inlet socket 11.

The surface of casing 13 serving as the mounting surface and carrying the terminals 31, 32 and 33 is not limited to a flat surface, but may be stepped as in a conventional device, or may have the ground terminal mounted on a thick projection as in the conventional device shown in FIGS. 10 and 11.

Also, each retainer portion is optional in number, mounting position, configuration and forming method.

Similarly, the configuration of each hook is variable in design.

Each terminal is not limited to a pin-shaped one, but may be lug-shaped or the like. Also, the number of terminals is subject to design considerations and, in particular, there may be plural ground terminals.

Although several embodiments have been described, they are merely exemplary of the invention and not to be construed as limiting, the invention being defined solely by the appended claims.

We claim:

1. An inlet type noise filter device comprising:
   a casing having an open end and a surface extending perpendicular to said open end, said casing comprising an insulating resin portion and a metal portion extending over said insulating resin portion and in which said insulating resin portion is disposed;
   an inlet socket disposed over the open end of said casing and including a bayonet portion;
   a ground terminal and output terminals projecting from and extending perpendicular to said surface of said casing;
   a filter circuit means for filtering noise, said circuit disposed within said casing and operatively electrically connected to said socket and said terminals;
   a printed substrate on which said casing is mounted, said ground terminals and said output terminal secured directly to said printed substrate; and
   the metal portion of said casing including retaining portions extending in the same direction as do said terminals, said retaining portions engaging said printed substrate for securing said casing in which the filter circuit is disposed to said printed substrate.

2. An inlet type noise filter device as claimed in claim 1,
   wherein said terminals are each pin-shaped.

3. An inlet type noise filter as claimed in claim 1,
   wherein each of said retainer portions comprises a retaining piece having an outermost end spaced from said surface; and a hook extending from said outermost end of the retaining piece and inclined thereto.

4. An inlet type noise filter device as claimed in claim 1,
   wherein said device further comprises a box including an inlet wall, said inlet wall having an opening extending therethrough and slits defined therein alongside said opening, and
   wherein said bayonet portion includes a flange portion extending in said slits for mounting said casing to said box, said inlet socket extending in said opening so as to be exposed at the exterior of said box.

* * * * *